(12) United States Patent
Ikeda et al.

(10) Patent No.: US 11,837,436 B2
(45) Date of Patent: Dec. 5, 2023

(54) WAVEFORM GENERATING DEVICE, WAVEFORM GENERATING METHOD, AND CHARGED PARTICLE BEAM IRRADIATION APPARATUS

(71) Applicant: NuFlare Technology, Inc., Yokohama (JP)

(72) Inventors: Michihiko Ikeda, Ota-ku (JP); Akinori Mine, Yokohama (JP); Kuniaki Kawahara, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 162 days.

(21) Appl. No.: 17/646,067

(22) Filed: Dec. 27, 2021

(65) Prior Publication Data

US 2022/0246396 A1 Aug. 4, 2022

(30) Foreign Application Priority Data

Feb. 4, 2021 (JP) .................................. 2021-016707

(51) Int. Cl.
*H01J 37/302* (2006.01)
*H03M 1/06* (2006.01)
*H01J 37/147* (2006.01)

(52) U.S. Cl.
CPC .......... *H01J 37/302* (2013.01); *H01J 37/147* (2013.01); *H03M 1/0604* (2013.01)

(58) Field of Classification Search
CPC ................... H01J 37/302; H01J 37/147; H01J 2237/1504; H01J 37/304; H01J 37/3174; H03M 1/0604; H03M 1/0678; H03M 1/121; H03M 1/0863; H03M 1/66; G21K 5/00; G03F 1/20
USPC ..................... 250/396 R, 306, 307, 310, 311
See application file for complete search history.

(56) References Cited

FOREIGN PATENT DOCUMENTS

| JP | 4-51612 A | | 2/1992 | |
| JP | H0451612 A | * | 2/1992 | .............. H03M 1/08 |
| JP | 6-132821 A | | 5/1994 | |
| JP | 2002-141801 A | | 5/2002 | |

* cited by examiner

*Primary Examiner* — Michael Maskell
(74) *Attorney, Agent, or Firm* — Oblon, McClelland, Maier & Neustadt, L.L.P.

(57) ABSTRACT

In one embodiment, a waveform generating device includes a first DA converter converting input data, a controller outputting a first signal having a command value based on the input data, and a second signal having a command value differing by a constant value from the first signal, a second DA converter converting the first signal, a third DA converter converting the second signal, and a combiner combining the output of the first DA converter, the output of the second DA converter, and the output of the third DA converter. When a value of a predetermined first high-order bit of the input data is inverted, the controller changes the command value of the first signal such that a value of the first high-order bit or a second high-order bit different from the first high-order bit is inverted.

20 Claims, 10 Drawing Sheets

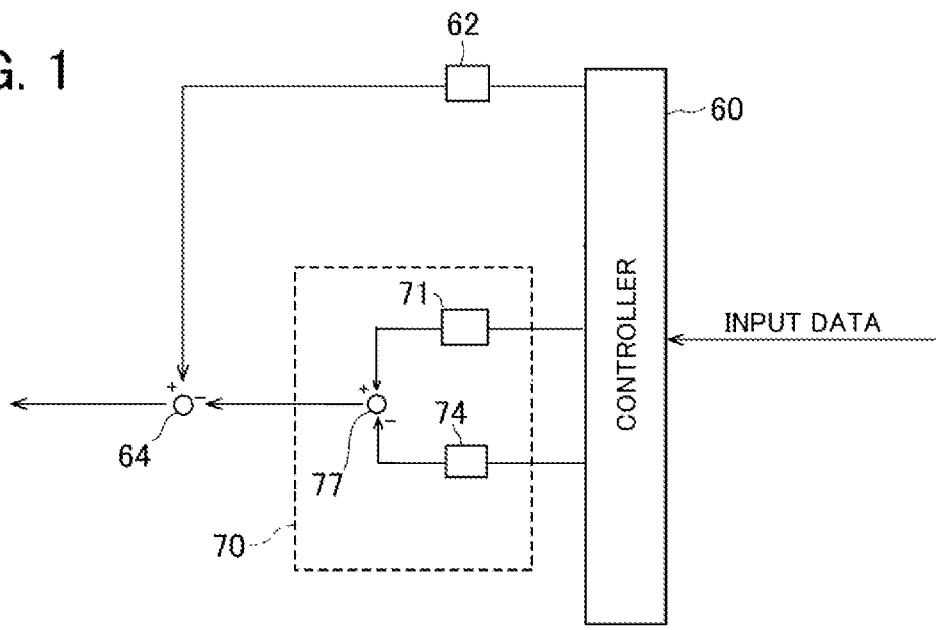
FIG. 1
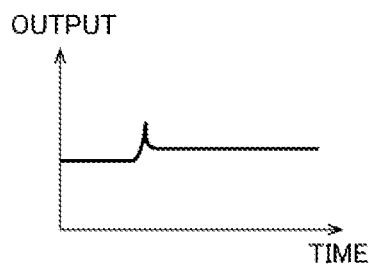
FIG.2A
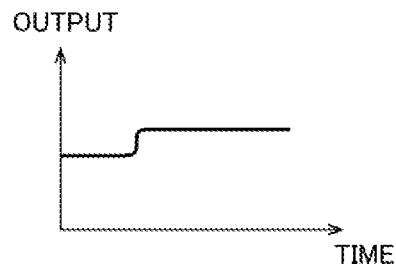
FIG.2B
FIG.2C

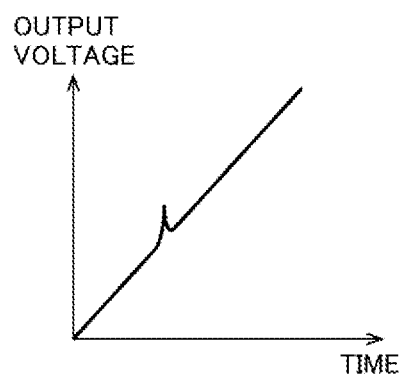
FIG.3A
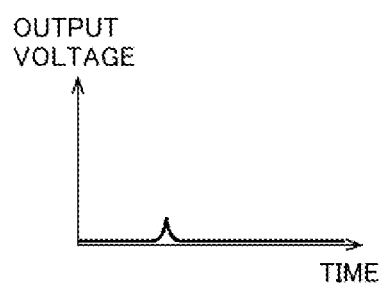
FIG.3B
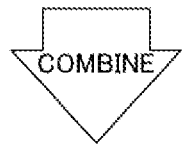
COMBINE
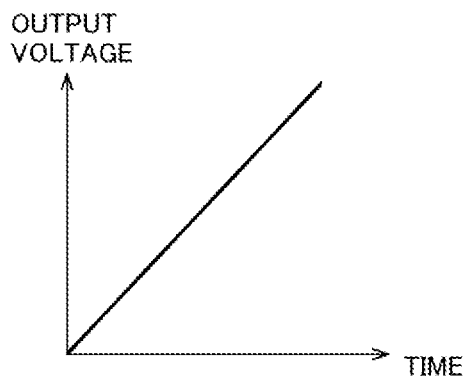
FIG.3C

FIG.4
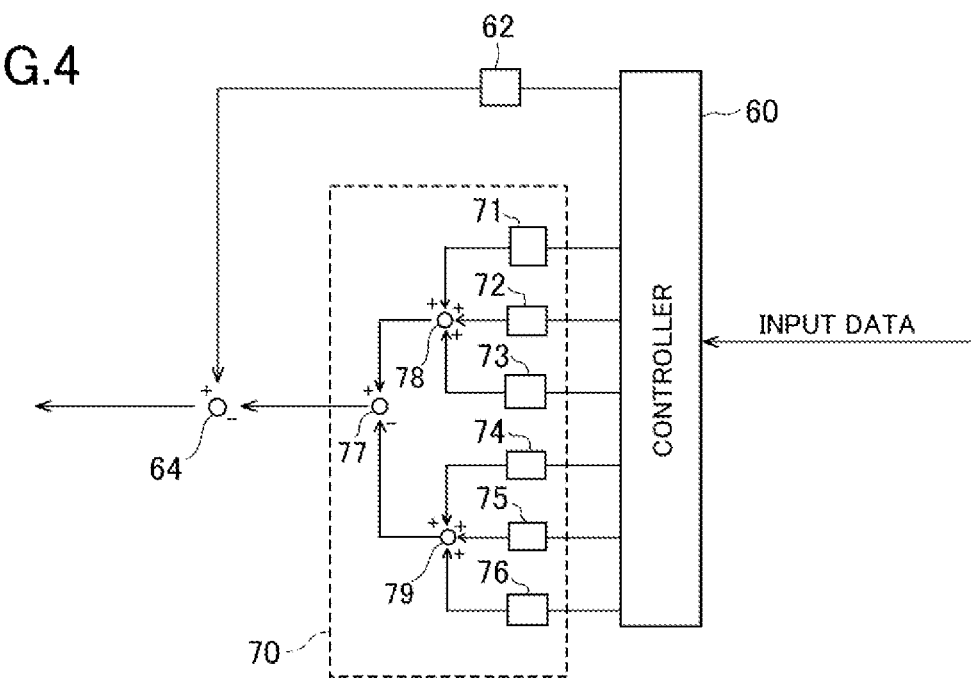
FIG.5A
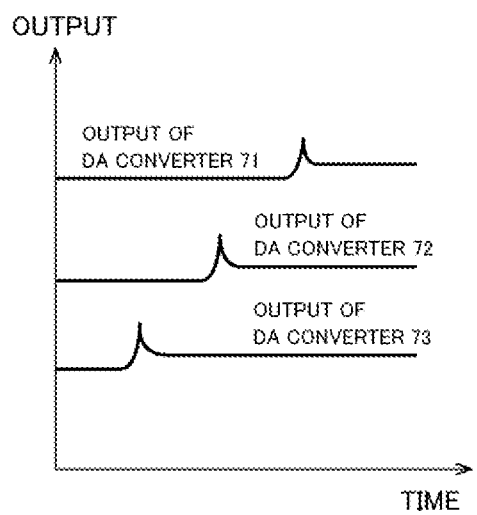
FIG.5B
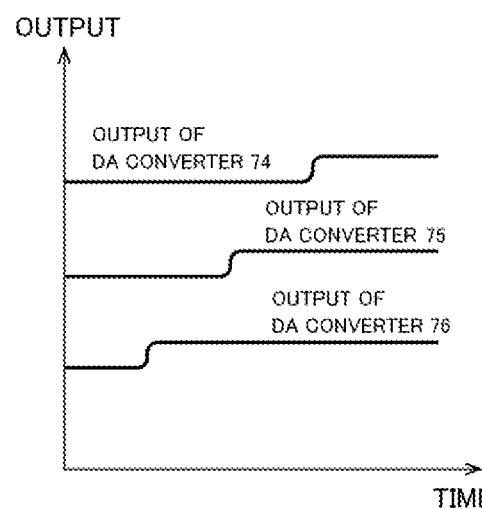
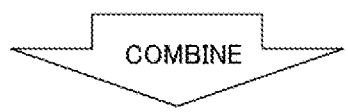
FIG.5C
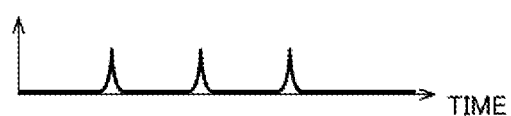

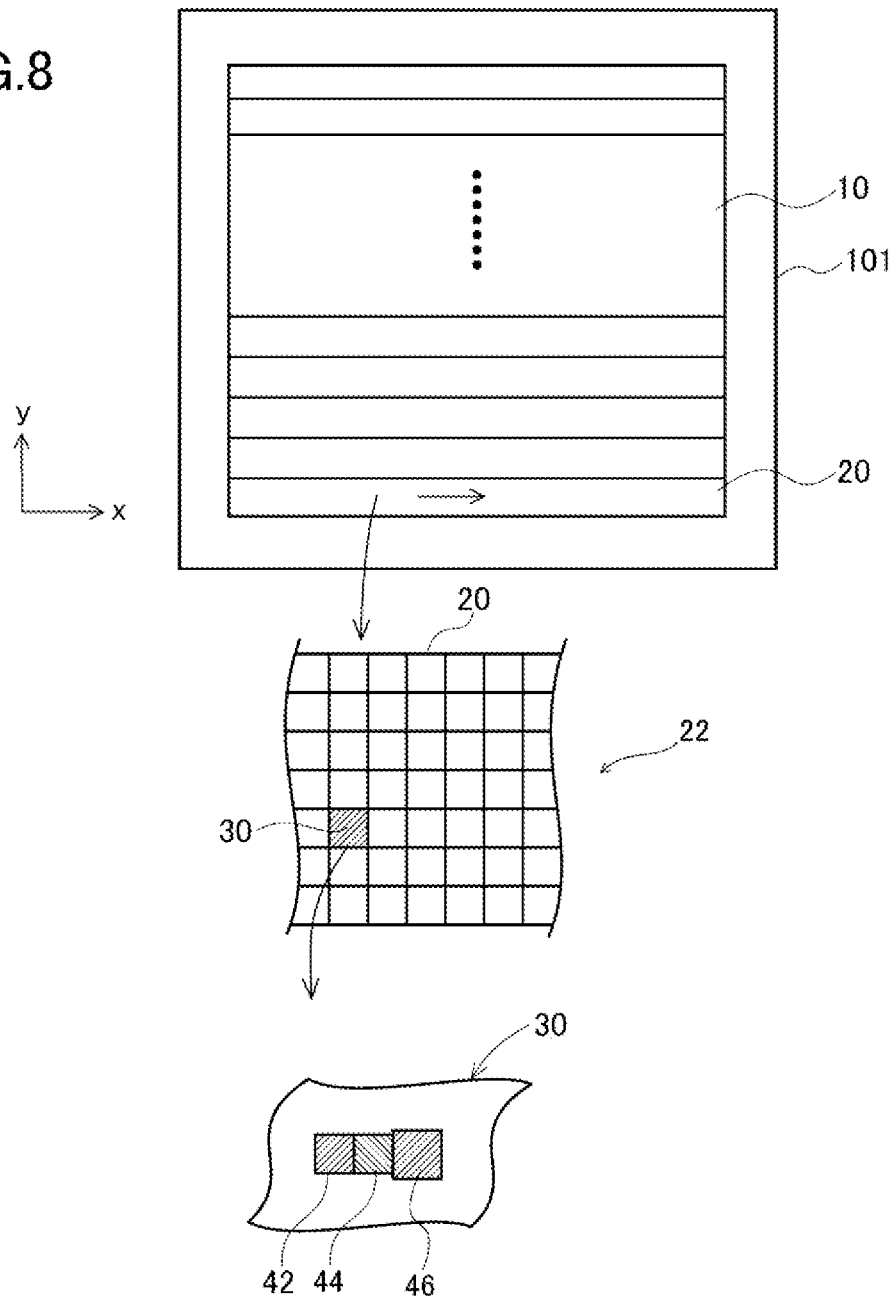

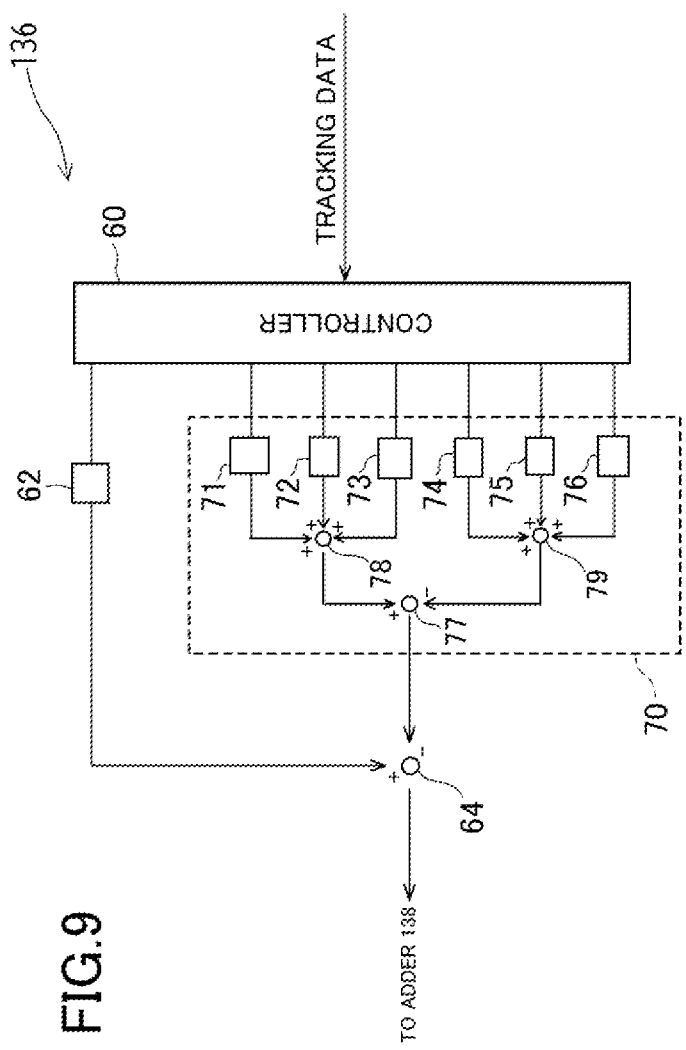

FIG.10E

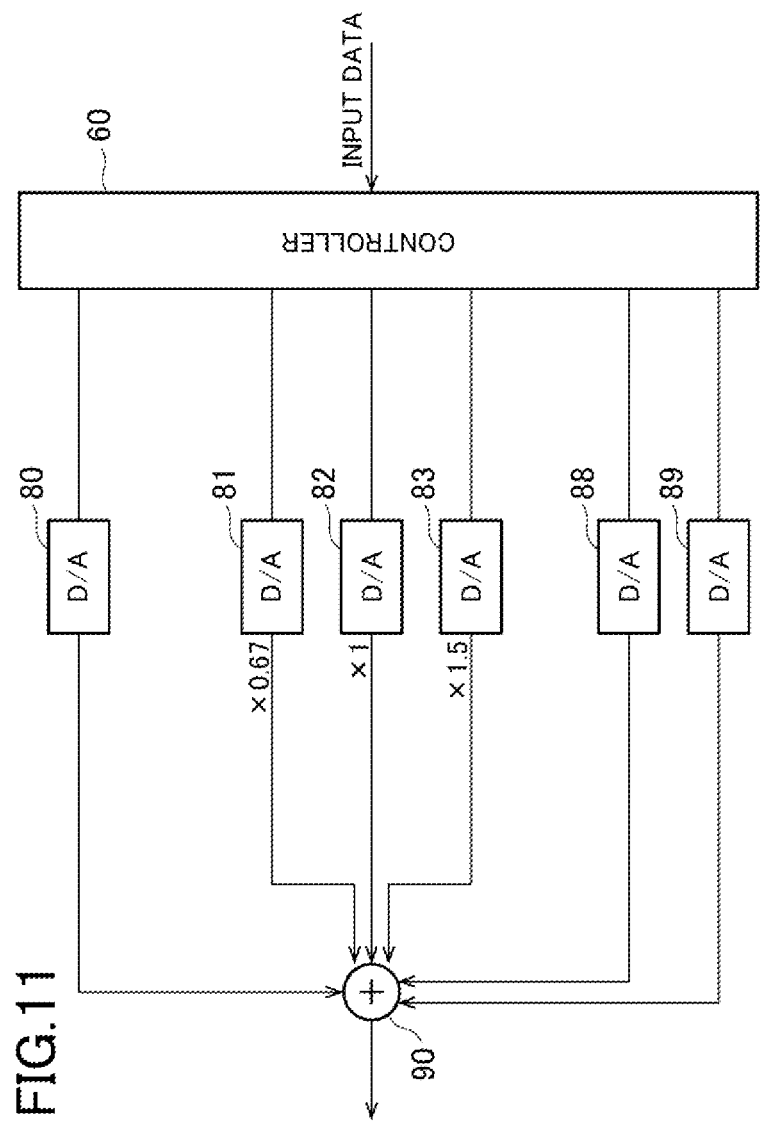

WAVEFORM GENERATING DEVICE, WAVEFORM GENERATING METHOD, AND CHARGED PARTICLE BEAM IRRADIATION APPARATUS

CROSS REFERENCE TO RELATED APPLICATION

This application is based upon and claims benefit of priority from the Japanese Patent Application No. 2021-016707, filed on Feb. 4, 2021, the entire contents of which are incorporated herein by reference.

FIELD

The present invention relates to a waveform generating device, a waveform generating method, and a charged particle beam irradiation apparatus.

BACKGROUND

As the density of LSI increases, the circuit line widths and metal wiring pitches of semiconductor devices become finer year by year. Circuit patterns of such semiconductor devices are formed by a technique in which a step-and-repeat exposure system is used to transfer a highly precise original pattern formed on a quartz member onto a wafer at a reduced scale by using, for example, an ArF laser (optical lithography). To form finer patterns, EUV lithography using extreme ultraviolet has started to be used in recent years. EUV lithography involves using a mask that has a multilayer structure of a plurality of materials. Regardless of the type of mask used, a highly precise original pattern is formed by a so-called electron-beam lithography technique in which a resist on a mask blank is selectively exposed to light by an electron-beam writing apparatus.

Electron beam writing is performed while a stage having a substrate (writing target) placed thereon is being moved. To prevent the beam irradiation position from being displaced as the stage moves, tracking control is performed to cause the beam irradiation position to follow the movement of the stage. During continuous operation of a tracking amplifier that outputs a deflection voltage for tracking control, a glitch (momentary sudden change in voltage) may occur in the output. The occurrence of a glitch causes displacement of the beam irradiation position and degrades writing accuracy.

BRIEF DESCRIPTION OF THE DRAWINGS

FIG. 1 is a block diagram of a waveform generating device according to an embodiment of the present invention.

FIG. 2A is a graph showing the output of a DA converter including a glitch, FIG. 2B is a graph showing the output of a DA converter for cancelling displacement, and FIG. 2C is a graph showing a glitch waveform.

FIG. 3A is a graph showing the output of a DA converter including a glitch, FIG. 3B is a graph showing a compensation glitch waveform, and FIG. 3C is a graph showing a voltage waveform obtained by cancelling the glitch.

FIG. 4 is a block diagram of a modified waveform generating device.

FIG. 5A is a graph showing the outputs of DA converters including glitches, FIG. 5B is a graph showing the outputs of DA converters for cancelling displacement, and FIG. 5C is a graph showing a glitch waveform.

FIG. 8 is a diagram for explaining each region.

FIG. 9 is a schematic block diagram of a tracking amplifier.

FIG. 10C and FIG. 10E are diagrams each illustrating an exemplary waveform obtained by combining the compensation glitch waveforms.

FIG. 11 is a block diagram of a waveform generating device according to another embodiment.

DETAILED DESCRIPTION

Figure 6A:
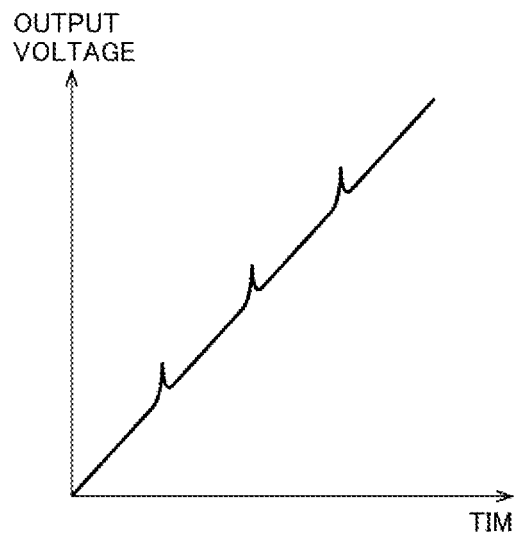
FIG. 6A is a graph showing the output of the DA converter including glitches.

In one embodiment, a waveform generating device includes a first DA converter converting input data from digital to analog and provide an output, a controller outputting a first signal having a command value based on the input data, and a second signal having a command value differing by a constant value from the command value of the first signal, a second DA converter converting the first signal from digital to analog and provide an output, a third DA converter converting the second signal from digital to analog and provide an output, and a combiner combining the output of the first DA converter, the output of the second DA converter, and the output of the third DA converter. When a value of a predetermined first high-order bit of the input data is inverted, the controller changes the command value of the first signal such that a value of the first high-order bit or a second high-order bit different from the first high-order bit is inverted.

An embodiment of the present invention will be described below with reference to the drawings.

FIG. 1 illustrates a configuration of a waveform generating device according to an embodiment of the present invention. As illustrated in FIG. 1, the waveform generating device includes a controller 60, a DA converter 62 (first DA converter), a combiner 64, and a compensation glitch generating unit 70.

The DA converter 62 receives, through the controller 60, input data having a command value of a digital signal, and converts the input data to an analog signal. The DA converter 62 provides an output proportional to the received command value. In a binary representation of the command value, the most weighted bit in the output is referred to as the most significant bit, and the least weighted bit in the output is referred to as the least significant bit. The command value changes sequentially.

When a change of a command value involves inversion of a high-order bit, a large glitch occurs in the output of the DA converter 62. For example, when a command value expressed in an eight-bit binary representation (offset binary) changes from "00111111" (hereinafter, a binary number is enclosed in double quotation marks) to "01000000", or from "01000000" to "00111111", the second high-order bit is inverted. This causes a large glitch to occur in the output of the DA converter 62. Generally, a larger glitch tends to occur in association with inversion of a higher-order bit.

The controller 60 monitors input data and when a change of a command value involves inversion of a high-order bit, the controller 60 causes the compensation glitch generating unit 70 to generate a compensation glitch waveform. The combiner 64 subtracts the compensation glitch waveform generated by the compensation glitch generating unit 70 from the output of the DA converter 62 including a glitch, so as to cancel the glitch appearing in the output of the DA converter 62.

When a change of a command value does not involve inversion of a high-order bit (i.e., when only a low-order bit is inverted), as in the case of a change from "00000001" to "00000010", there is little or no occurrence of a glitch in the output of the DA converter 62. This means that there is no need to generate a compensation glitch.

The compensation glitch generating unit 70 includes a DA converter 71 and a DA converter 74 arranged in parallel, and a combiner 77. In this example, inversion of the first high-order bit of a command value is followed by the occurrence of a large glitch in the output of the DA converter 62.

The DA converter 71 (second DA converter) receives, from the controller 60, a first signal having an eight-bit command value whose most significant bit is inverted. This causes a large glitch to occur in the output of the DA converter 71. For example, the DA converter 71 receives as an input a command value whose most significant bit is inverted, such as a command value that changes from "01111111" to "10000000" (or vice versa).

In accordance with an input to the DA converter 62, the DA converter 71 receives one of these two command values as an input. Specifically, if the input to the DA converter 62 is smaller than or equal to "01111111" (from "00000000" to "01111111"), the DA converter 71 receives "01111111" as an input, whereas if the input to the DA converter 62 is greater than or equal to "10000000" (from "10000000" to "11111111"), the DA converter 71 receives "10000000" as an input.

For example, if the input to the DA converter 62 changes sequentially as "01111110"→"01111111"→"10000000" "10000001", then the input to the DA converter 71 changes as "01111111"→"01111111"→"10000000"→"10000000".

When the input to the DA converter 71 (and DA converter 62) changes from "01111111" to "10000000", the output of the DA converter 71 includes a glitch associated with inversion of the first high-order bit.

The DA converter 74 (third DA converter) receives, from the controller 60, a second signal having an eight-bit command value whose most significant bit is not inverted. This means that there is no occurrence of a (large) glitch in the output of the DA converter 74. The second signal has the same amount of displacement as the first signal received by the DA converter 71.

The DA converter 74 receives as an input an eight-bit command value that differs by one least significant bit ("00000001") from the input to The DA converter 71. For example, the DA converter 74 receives an eight-bit command value that changes from "10000000" to "10000001". Differing by one least significant bit means that adding "00000001" to (or subtracting "00000001" from) one value produces the other value. Accordingly, when the DA converter 71 receives "01111111" as an input, the DA converter 74 receives "10000000" as an input, whereas when the DA converter 71 receives "10000000" as an input, the DA converter 74 receives "10000001" as an input (or in the case of subtracting "00000001", when the DA converter 71 receives "01111111" as an input, the DA converter 74 receives "01111110" as an input, whereas when the DA converter 71 receives "10000000" as an input, the DA converter 74 receives "01111111" as an input).

FIG. 2A illustrate an exemplary output of the DA converter 71. FIG. 2B illustrate an exemplary output of the DA converter 74. When an input to the DA converter 71 changes from "01111111" to "10000000", the inversion of the most significant bit causes a glitch to occur. Since the change of an input to the DA converter 74 does not involve inversion of a high-order bit, no glitch occurs in the output.

When the combiner 77 subtracts the output of the DA converter 74 from the output of the DA converter 71 (FIG. 2A-FIG. 2B), a glitch waveform associated with inversion of the most significant bit can be extracted as illustrated in FIG. 2C. Although an offset of one least significant bit ("00000001") remains, which is a difference between the output of the DA converter 71 and the output of the DA converter 74, it can be ignored (or accepted) as it is extremely small relative to the glitch waveform. The glitch waveform extracted, as described above, is used to compensate for a glitch that occurs in the output of the DA converter 62 when an input to the DA converter 62 changes from "01111111" to "10000000".

In accordance with the timing at which the most significant bit of the command value received by the DA converter 62 is inverted, the controller 60 causes the DA converters 71 and 74 and the combiner (subtractor) 77 to generate a compensation glitch waveform.

FIG. 3A illustrate an exemplary output of the DA converter 62. In this example, an input to the DA converter 62 monotonously increases with time. The combiner 64 subtracts a compensation glitch waveform illustrated in FIG. 3B from the output of the DA converter 62 (i.e., subtracts FIG. 3B from FIG. 3A) to cancel the glitch as illustrated in FIG. 3C.

Subtraction of the output of the DA converter 71 from, and addition of the output of the DA converter 74 to, the output of the DA converter 62 may be performed in any order. For example, subtraction of the output of the DA converter 71 from the output of the DA converter 62 may be followed by addition of the output of the DA converter 74 to the output of the DA converter 62. Addition of the output of the DA converter 74 to the output of the DA converter 62 may be followed by subtraction of the output of the DA converter 71 from the output of the DA converter 62.

As long as a glitch in the output of the DA converter 62 is suppressed, any technique (addition or subtraction) may be used to combine the output of the DA converter 71 and the output of the DA converter 74 with the output of the DA converter 62. For example, an input to the DA converter 71 and an input to the DA converter 74 may be set such that adding the output of the DA converter 71 and the output of the DA converter 74 to the output of the DA converter 62 can produce a desired signal.

The combiner 64 and the combiner 77 included in the compensation glitch generating unit 70, illustrated in FIG. 1, may be functionally combined together. For example, the combiner 64 and the combiner 77 included in the compensation glitch generating unit 70, illustrated in FIG. 1, may be combined to form a combiner constituted by a single analog circuit.

FIG. 4 illustrates a configuration of a waveform generating device for cancelling a glitch that occurs in the output of the DA converter 62 when the first high-order bit of a command value of input data is inverted and when the second high-order bit of the command value is inverted. This waveform generating device is obtained by adding DA converters 72, 73, 75, and 76 to the compensation glitch generating unit 70 of the waveform generating device illustrated in FIG. 1 in such a manner that they are parallel to the DA converters 71 and 74, and also adding combiners 78 and 79 to the compensation glitch generating unit 70. The operation of the DA converters 71 and 74 will not be described here, as it is the same as that described above.

The combiner 78 adds up the outputs of the DA converters 71 to 73 (second DA converter group), and the combiner 79 adds up the outputs of the DA converters 74 to 76 (third DA converter group). The combiner 77 subtracts the output of the combiner 79 from the output of the combiner 78.

The magnitude of a glitch that occurs when the second high-order bit of the command value of input data is inverted is assumed to vary depending on the value of the first high-order bit (most significant bit). Accordingly, a glitch that occurs when the second high-order bit is inverted will be discussed separately for different values of the most significant bit.

In accordance with the required precision or the like, the designers may appropriately determine a high-order bit, such as "the third high-order bit" or "the fourth high-order bit", up to which the inversion of high-order bits in the command value causes a large glitch to occur in the output of the DA converter 62. The determined range may be, for example, within the highest half of all bits of the command value. However, not all the highest half are to be inverted. For example, although advantageous effects may be reduced, a compensation glitch waveform may be generated only for a glitch associated with inversion of only some of the highest half of all bits, such as the most significant bit or the second high-order bit.

The DA converter 72 receives as an input an eight-bit command value where the most significant bit is 0 and the second high-order bit is inverted, such as a command value that changes from "00111111" to "01000000" (or vice versa).

In accordance with an input to the DA converter 62, the DA converter 72 receives one of these two command values as an input. Specifically, if the input to the DA converter 62 is smaller than or equal to "00111111" (from "00000000" to "00111111"), the DA converter 72 receives "00111111" as an input, whereas if the input to the DA converter 62 is greater than or equal to "01000000" (from "01000000" to "11111111"), the DA converter 72 receives "01000000" as an input. When the input to the DA converter 72 (and DA converter 62) changes from "00111111" to "01000000", the output of the DA converter 72 includes a glitch associated with inversion of the second high-order bit.

The DA converter 73 receives as an input an eight-bit command value where the most significant bit is 1 and the second high-order bit is inverted, such as a command value that changes from "10111111" to "11000000" (or vice versa).

In accordance with an input to the DA converter 62, the DA converter 73 receives one of these two command values as an input. Specifically, if the input to the DA converter 62 is smaller than or equal to "10111111" (from "00000000" to "10111111"), the DA converter 73 receives "10111111" as an input, whereas if the input to the DA converter 62 is greater than or equal to "11000000" (from "11000000" to "11111111"), the DA converter 71 receives "11000000" as an input. When the input to the DA converter 73 (and DA converter 62) changes from "10111111" to "11000000", the output of the DA converter 73 includes a glitch associated with inversion of the second high-order bit.

The DA converter 75 receives as an input a command value that differs by one least significant bit ("00000001") from the input to the DA converter 72, such as a command value that changes from "01000000" to "01000001". By subtracting the output of the DA converter 75 from the output of the DA converter 72, a glitch waveform can be extracted which is generated in association with inversion of the second high-order bit when the most significant bit is 0. The glitch waveform is used to compensate for a glitch that occurs in the output of the DA converter 62 when an input to the DA converter 62 changes from "00111111" to "01000000".

The DA converter 76 receives as an input a command value that differs by one least significant bit ("00000001") from the input to the DA converter 73, such as a command value that changes from "11000000" to "11000001" in the case of adding "00000001" (or from "10111110" to "10111111" in the case of subtracting "00000001"). By subtracting the output of the DA converter 76 from the output of the DA converter 73, a glitch waveform can be extracted which is generated in association with inversion of the second high-order bit when the most significant bit is 1. The glitch waveform is used to compensate for a glitch that occurs in the output of the DA converter 62 when an input to the DA converter 62 changes from "10111111" to "11000000".

In accordance with the timing at which the second high-order bit of the command value received by the DA converter 62 is inverted when the most significant bit of the command value is 0, the controller 60 varies the inputs to the DA converters 72 and 75 to cause the combiner 77 to output a compensation glitch waveform.

In accordance with the timing at which the second high-order bit of the command value received by the DA converter 62 is inverted when the most significant bit of the command value is 1, the controller 60 varies the inputs to the DA converters 73 and 76 to cause the combiner 77 to output a compensation glitch waveform.

FIG. 5A illustrates exemplary outputs of the DA converters 71 to 73. FIG. 5B illustrates exemplary outputs of the DA converters 74 to 76. FIG. 5C illustrates an exemplary compensation glitch waveform generated by using the outputs of the DA converters 71 to 76. The combiners 77 to 79 combine the outputs of the DA converters 71 to 76, that is, perform the following computation to obtain the compensation glitch waveform illustrated in FIG. 5C: (output of the DA converter 71)+(output of the DA converter 72)+(output of the DA converter 73)−(output of the DA converter 74)−(output of the DA converter 75)−(output of the DA converter 76).

Figure 6B:
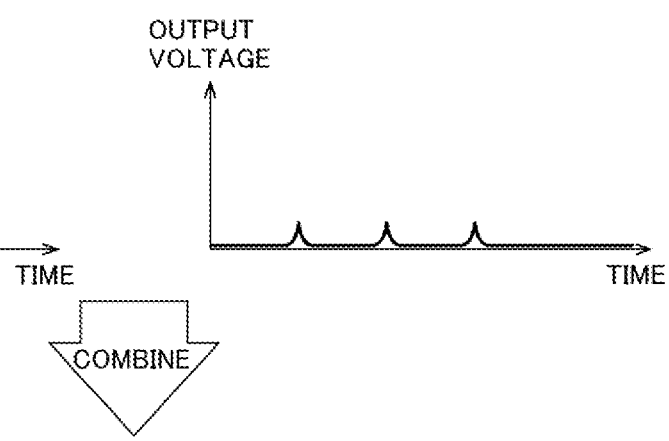
FIG. 6B is a graph showing a compensation glitch waveform.
Figure 6C:
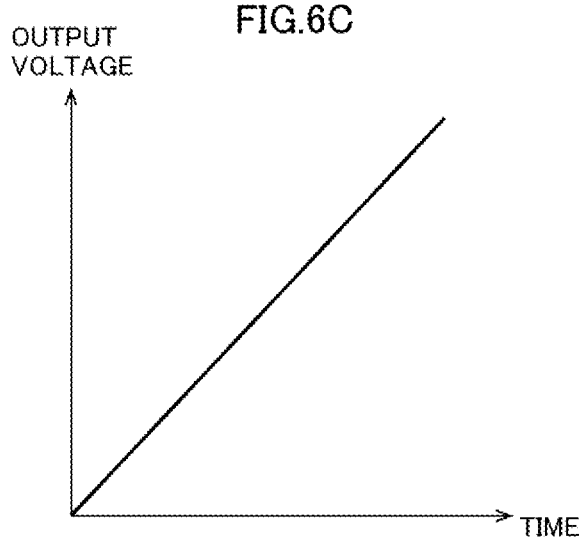
FIG. 6C is a graph showing a voltage waveform obtained by cancelling the glitches.

FIG. 6A illustrate an exemplary output of the DA converter 62. In this example, an input to the DA converter 62 monotonously increases with time. The combiner 64 subtracts a compensation glitch waveform illustrated in FIG. 6B from the output of the DA converter 62 (i.e., subtracts FIG. 6B from FIG. 6A) to cancel the glitch as illustrated in FIG. 6C.

In the embodiment described above, the compensation glitch generating unit 70 includes a total of six DA converters, which are composed of three DA converters 71 to 73 and three DA converters 74 to 76 for cancelling displacement, to compensate for a glitch associated with inversion of the first and second high-order bits. To compensate for a glitch associated with inversion of up to the n-th high-order bit (where n is an integer greater than or equal to 1), the compensation glitch generating unit 70 includes $(2^n-1) \times 2$ DA converters.

When the compensation glitch generating unit 70 extracts a glitch waveform, an offset of one least significant bit ("00000001") remains in the embodiment described above. However, the offset can ultimately be reduced to zero by balancing the operations of the DA converters 74 to 76. For example, the inputs to the DA converters 71 to 76 are set as listed below in accordance with a change in input to the DA converter 62.

DA converter 62 "01111111"→"10000000"
DA converter 71 "01111111"→"10000000"
DA converter 74 "01111101"→"01111110"
DA converter 62 "00111111"→"01000000"
DA converter 72 "00111111"→"01000000"
DA converter 75 "01000000"→"01000001"
DA converter 62 "10111111"→"11000000"
DA converter 73 "10111111"→"11000000"
DA converter 76 "11000000"→"11000001"

An input to the DA converter 75 is greater by one least significant bit than an input to the DA converter 72, and an input to the DA converter 76 is greater by one least significant bit than an input to the DA converter 73. At the same time, an input to the DA converter 74 is smaller by two least significant bits than an input to the DA converter 71. This can ultimately reduce the offset to zero.

Although an input value received by the DA converter 62 increases in the embodiment described above, the same process is applicable to the cases where the input value decreases.

In the embodiment described above, after a signal obtained by adding up the outputs of the DA converters 74 to 76 is subtracted from a signal obtained by adding up the outputs of the DA converters 71 to 73 to generate a compensation glitch waveform, the compensation glitch waveform is subtracted from the output of the DA converter 62. However, the order of combining the signals is not limited to this. For example, subtracting a signal obtained by adding up the outputs of the DA converters 71 to 73 from the output of the DA converter 62 may be followed by adding, to the resulting signal, a signal obtained by adding up the outputs of the DA converters 74 to 76. Alternatively, adding a signal obtained by adding up the outputs of the DA converters 74 to 76 to the output of the DA converter 62 may be followed by subtracting, from the resulting signal, a signal obtained by adding up the outputs of the DA converters 71 to 73.

A description will now be given of a charged particle beam irradiation apparatus that includes the waveform generating device described above. In the configuration of the present embodiment, an electron beam is used as an exemplary charged particle beam. The charged particle beam is not limited to an electron beam and may be, for example, an ion beam. Although a configuration of the writing apparatus will be described as an example of the irradiation apparatus in the present embodiment, the irradiation apparatus may be, for example, an inspection apparatus.

Figure 7:
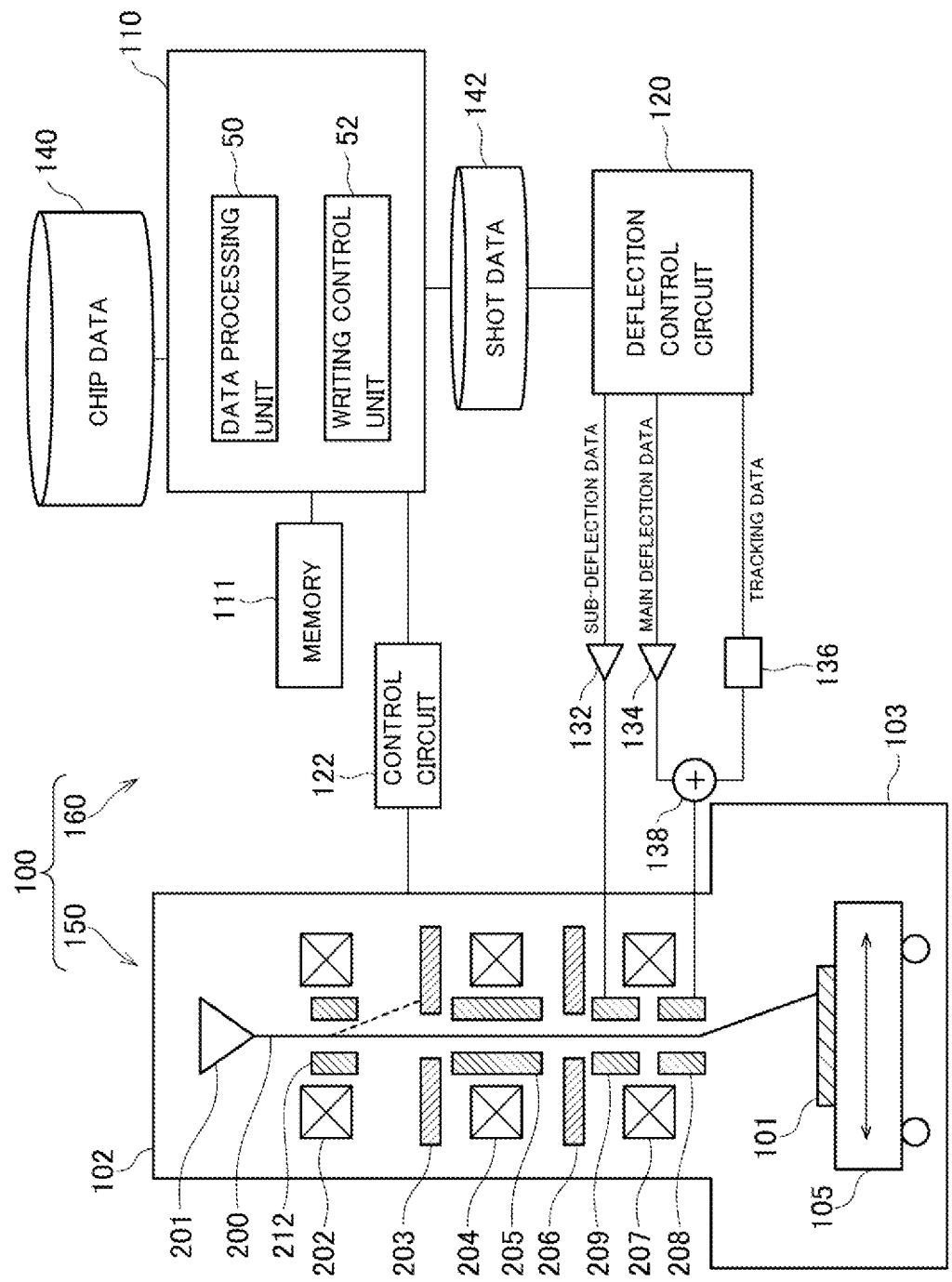
FIG. 7 is a block diagram of a writing apparatus according to an embodiment of the present invention.

FIG. 7 is a conceptual diagram illustrating a configuration of a writing apparatus according to an embodiment of the present invention. In FIG. 7, a writing apparatus 100 includes a writer 150 and a controller 160. The writing apparatus 100 is an exemplary variable-shaped beam writing apparatus.

The writer 150 includes an electron barrel (electron beam column) 102 and a writing chamber 103. The electron barrel 102 contains an electron gun 201, an illuminating lens 202, a blanking deflector 212, a first shaping aperture substrate 203, a projection lens 204, a deflector 205, a second shaping aperture substrate 206, an objective lens 207, a main deflector 208, and a sub-deflector 209. The writing chamber 103 contains an XY stage 105. A resist-coated substrate 101 (writing target), such as a mask, is placed on the XY stage 105. The substrate 101 is, for example, a mask for exposure in manufacture of a semiconductor device, or a resist-coated mask blank to which nothing has been written.

The controller 160 includes a control computer 110, a memory 111, a deflection control circuit 120, a control circuit 122, a digital-to-analog converter (DAC) amplifiers 132, 134, and 136, an adder 138, and storage devices 140 and 142, such as magnetic disk devices. The DAC amplifiers 132, 134, and 136 are connected to the deflection control circuit 120. The adder 138 is connected to the outputs of the DAC amplifiers 134 and 136.

The DAC amplifier 132 is connected to the sub-deflector 209. The DAC amplifier 134 is connected at the output thereof to the adder 138. The DAC amplifier 136 is connected at the output thereof to the adder 138. The adder 138 is connected at the output thereof to the main deflector 208.

The deflection control circuit 120 outputs a corresponding digital signal for control to each of the DAC amplifiers 132, 134, and 136. The DAC amplifiers 132, 134, and 136 each convert the received digital signal to an analog signal, amplifies it, and outputs it as a deflection voltage. A value (sum) obtained by adding up the outputs of two DAC amplifiers 134 and 136 is applied to the main deflector 208 as a deflection voltage for main deflection. The output of the DAC amplifier 132 is applied to the sub-deflector 209 as a deflection voltage for sub-deflection. An electron beam is deflected by these deflection voltages. Under the control of a writing control unit 52 in the control computer 110, the control circuit 122 controls the operation of the writer 150.

The control computer 110 includes a data processing unit 50 and the writing control unit 52. The "units", such as the data processing unit 50 and the writing control unit 52, each include a processing circuit. The processing circuit includes, for example, an electric circuit, a computer, a processor, a circuit board, a quantum circuit, or a semiconductor device. The "units" may either use a common processing circuit (same processing circuit) or different processing circuits (individual processing circuits). Input and output information to and from the data processing unit 50 and the writing control unit 52 and information being subjected to computation are stored as needed in the memory 111.

Data of a chip pattern to be written (chip data) is received from outside the writing apparatus 100 and stored in the storage device 140. The chip data defines, for example, a figure code indicating the figure type of a figure pattern to be written, as well as the layout coordinates and the dimensions of the figure pattern. Information representing the amount of irradiation may be defined in the same data, or may be defined in different data and received as an input.

FIG. 8 is a conceptual diagram for explaining each region. In FIG. 8, a writing region 10 of the substrate 101 is virtually divided, for example, in the y direction into a plurality of stripe regions 20 with a deflectable width of the main deflector 208. The main deflector 208 performs deflection in the x and y directions within a main deflection region 22 defined by the deflectable widths of the main deflector 208. Each stripe region 20 is virtually divided in a mesh pattern into a plurality of subfields (SF) 30 (subregions) of a deflectable size of the sub-deflector 209. FIG. 8 shows an example where shot FIGS. 42, 44, and 46 are written at shot positions in a given SF 30.

The deflection control circuit 120 outputs a digital signal for blanking control to a DAC amplifier for blanking control (not shown). The DAC amplifier for blanking control converts the digital signal to an analog signal, amplifies it, and applies it as a deflection voltage to the blanking deflector 212. The blanking deflector 212 deflects the electron beam 200 and turns ON and OFF the beam.

The deflection control circuit 120 outputs a digital signal for beam shaping control to a DAC amplifier for beam shaping control (not shown). The DAC amplifier for beam shaping control converts the digital signal to an analog signal, amplifies it, and applies it as a deflection voltage to the deflector 205. By deflecting the electron beam 200, the deflector 205 controls the position at which the electron beam 200 passes through the opening in the second shaping aperture substrate 206 after passing through the first shaping aperture substrate 203, so that the beam of each shot is variably shaped.

The deflection control circuit 120 outputs a digital signal for main deflection control (main deflection data) to the DAC amplifier 134 (first amplifier). The DAC amplifier 134 converts the digital signal to an analog signal, amplifies it, and applies it as a deflection voltage (first deflection voltage) to the main deflector 208. The main deflector 208 deflects the beam of each shot to a reference position in a predetermined one of the subfields (SFs) 30 into which the stripe region 20 is virtually divided in a mesh pattern.

At the same time, the deflection control circuit 120 outputs a digital signal for tracking control (tracking data) to the DAC amplifier 136 (second amplifier). The DAC amplifier 136 converts the digital signal to an analog signal, amplifies it, and applies it as a deflection voltage (second deflection voltage) to the main deflector 208. The deflection voltage for main deflection control and the deflection voltage for tracking control are added up by the adder 138 and applied as a deflection voltage to the main deflector 208.

The deflection control circuit 120 outputs a digital signal for sub-deflection control to the DAC amplifier 132. The DAC amplifier 132 converts the digital signal to an analog signal, amplifies it, and applies it as a deflection voltage to the sub-deflector 209. The sub-deflector 209 deflects the beam of each shot to the shot position in a predetermined one of the subfields (SFs) 30 into which the stripe region 20 is virtually divided in a mesh pattern.

The writing apparatus 100 performs a writing process on each of the stripe regions 20 using a deflector of multiple stages. In this example, a two-stage deflector composed of the main deflector 208 and the sub-deflector 209 is used.

For example, writing in the first stripe region 20 advances in the x direction while the XY stage 105 continuously moves in the −x direction. In the case of performing writing once in each stripe region 20 instead of performing multiple writing, the operation proceeds, for example, as follows. After completion of writing in the first stripe region 20, writing in the second stripe region 20 advances similarly or in the opposite direction. Writing in the third and subsequent stripe regions 20 is also performed in this manner. For writing in each stripe region 20, the main deflector 208 deflects the electron beam 200 to reference positions (e.g., centers) in the SFs 30 sequentially in such a manner as to follow the movement of the XY stage 105. The sub-deflector 209 deflects the electron beam 200 from the reference position in each SF 30 to each shot position of the beam irradiating the SF 30. The main deflector 208 and the sub-deflector 209 thus have deflection regions of different sizes. The SFs 30 are smallest of all the deflection regions for the multiple-stage deflector.

When the electron beam 200 emitted from the electron gun 201 (emitting unit) passes through the blanking deflector 212, which is controlled in accordance with a deflection signal from the DAC amplifier for blanking, the blanking deflector 212 controls the electron beam 200, in the beam ON state, such that the entire rectangular opening in the first shaping aperture substrate 203 is illuminated, whereas in the beam OFF state, the blanking deflector 212 deflects the electron beam 200 such that the entire beam is blocked by the first shaping aperture substrate 203. One electron beam shot is formed by the electron beam 200 that passes through the first shaping aperture substrate 203 during the period from the beam OFF state to ON state and then to the OFF state again. The blanking deflector 212 controls the direction of the electron beam 200 passing therethrough to alternately create the beam ON state and the beam OFF state. This may be done, for example, by applying no voltage to the blanking deflector 212 in the beam ON state, and applying a voltage to the blanking deflector 212 in the beam OFF state. The amount of irradiation per shot of the electron beam 200 that irradiates the substrate 101 is adjusted by varying the irradiation time of each shot.

With the electron beam 200 controlled in the beam ON state, the illuminating lens 202 illuminates the entire first shaping aperture substrate 203 having a rectangular opening. The electron beam 200 is shaped into a rectangle by the first shaping aperture substrate 203. After passing through the first shaping aperture substrate 203, the electron beam 200 forming a first aperture image is projected by the projection lens 204 onto the second shaping aperture substrate 206. The first aperture image on the second shaping aperture substrate 206 is deflection-controlled by the deflector 205 such that the beam shape and size are varied (variable beam shaping). Variable beam shaping is performed shot-by-shot such that, for example, the beam shape and size differ from one shot to another. After passing through the second shaping aperture substrate 206, the electron beam 200 forming a second aperture image is brought into focus by the objective lens 207, and is deflected by the main deflector 208 and the sub-deflector 209 to a desired position of the substrate 101 placed on the XY stage 105 that moves continuously.

In the example illustrated in FIG. 7, a multiple-stage deflector of main and sub two stages is used for positional deflection. In this example, the main deflector 208 may deflect the electron beam 200 of a shot to a reference position in the SF 30 while following the stage movement, and the sub-deflector 209 may deflect the beam of the shot to each irradiation position in the SF 30. By repeating this operation to combine the resulting shot figures, a desired figure pattern is written.

FIG. 9 is a block diagram of the DAC amplifier 136 (hereinafter also referred to as tracking amplifier 136) that outputs a deflection voltage for tracking control. A waveform generating device having the same configuration as that in FIG. 4 is applied to the tracking amplifier 136.

The DA converter 62 receives tracking data, which is a command value of a digital signal, from the deflection control circuit 120 through the controller 60 and converts the digital signal to an analog signal. The command value changes sequentially as the XY stage 105 moves.

The controller 60 monitors the tracking data and if the change of the command value involves inversion of high-order bits (or the first high-order bit and the second high-order bit in this example), the controller 60 causes the compensation glitch generating unit 70 to generate a compensation glitch waveform. The combiner (subtractor) 64 subtracts the compensation glitch generated by the compensation glitch generating unit 70 from the output of the DA converter 62 including a glitch to cancel the glitch appearing in the output of the DA converter 62.

Since a glitch in the output of the tracking amplifier 136 is suppressed, the amount of beam deflection made by the main deflector 208 is stabilized and this improves writing accuracy.

The components illustrated in FIG. 7 are those necessary to explain the embodiment. The writing apparatus 100 may include other components that are generally required. For example, although a multiple-stage deflector of main and sub two stages, the main deflector 208 and the sub-deflector 209, is used for positional deflection, a multiple-stage deflector of three or more stages may be used to perform positional deflection.

The main deflector 208 and the sub-deflector 209 each are composed of, for example, eight electrodes arranged around a region through which the electron beam 200 passes, and are provided with a DAC amplifier for each electrode. The deflector 205 for variable beam shaping is composed of, for example, four electrodes and also provided with a DAC amplifier (not shown) for each electrode. Similarly, the blanking deflector 212 is composed of, for example, two electrodes and also provided with a DAC amplifier (not shown) for at least one of the two electrodes.

Input devices, such as a mouse and a keyboard, a monitor device, and an external interface circuit may be connected to the writing apparatus 100.

The deflection control circuit 120 may include a waveform generating device having the same configuration as that illustrated in FIG. 4, convert a digital signal for beam shaping control, main deflection control, or sub-deflection control to an analog signal, and apply it as a deflection voltage to the deflector 205, the main deflector 208, or to the sub-deflector 209.

In the embodiment described above, when the value of a predetermined high-order bit of input data received by the first DA converter is inverted, the command value of an input signal received by the second DA converter is changed such that the value of the same bit as above is inverted, and the output of the second DA converter and the output of the third DA converter are combined to generate a compensation glitch waveform. For example, when the value of the most significant bit of the input data received by the first DA converter is inverted, the value of the most significant bit of the command value of the input signal received by the second DA converter is inverted.

However, a bit whose value is inverted in the input signal received by the second DA converter may differ from a bit whose value is inverted in the input data received by the first DA converter. Hereinafter, a description will be given using an example. For convenience of explanation, input data received by the first DA converter and the second DA converter are expressed in a four-bit binary representation.

For example, when an input to the first DA converter changes sequentially as "0010"→"0011"→"0100" →"0101", then an input to the second DA converter changes as "0111"→"0111"→"1000" "1000". That is, when the second high-order bit of the input to the first DA converter is inverted, the most significant bit of the input to the second DA converter is inverted.

An input to the third DA converter differs by one least significant bit ("0001") from an input to the second DA converter. That is, when an input to the second DA converter is "0111", an input to the third DA converter is "1000". Also, when an input to the second DA converter is "1000", an input to the third DA converter is "1001".

Combining an output of the second DA converter with an output of the third DA converter generates a compensation glitch waveform. Combining the compensation glitch waveform with an output of the first DA converter can suppress a glitch included in the output of the first DA converter.

Since the input to the first DA converter and the input to the second DA converter differ in the position of the inverted bit, the magnitude of a glitch included in the output of the first DA converter and the magnitude of a glitch included in the output of the second DA converter are different. Depending on the relation between the magnitude of a glitch included in the output of the first DA converter and the magnitude of a glitch included in the output of the second DA converter, the glitch included in the output of the first DA converter may not be fully suppressed by generating a compensation glitch waveform.

Figure 10A:
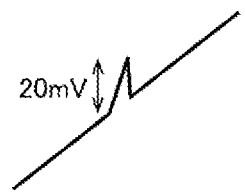
FIG. 10A is a diagram illustrating an exemplary output waveform of a DA converter.
Figure 10B:
FIG. 10B and FIG. 10D are diagrams each illustrating an exemplary compensation glitch waveform.
Figure 10C:
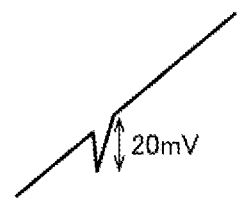

FIG. 10A illustrates an exemplary output of the first DA converter, and FIG. 10B illustrates an exemplary compensation glitch waveform. For example, when an input to the first DA converter changes sequentially as "0010"→"0011"→"0100" →"0101", a glitch with a magnitude of 20 mV occurs as illustrated in FIG. 10A. When an input to the second DA converter is changed as "0111"→"0111"→"1000" "1000", a compensation glitch waveform with a magnitude of 40 mV is generated as illustrated in FIG. 10B. If the output of the first DA converter (FIG. 10A) and the compensation glitch waveform (FIG. 10B) are simply combined by subtraction, a glitch of −20 mV remains as illustrated in FIG. 10C.

To effectively suppress the glitch included in the output of the first DA converter, it is preferable to amplify the output of the second DA converter (i.e., amplify a compensation glitch waveform obtained by combining the output of the second DA converter and the output of the third DA converter).

Figure 10D:

In the example described above, for example, both the output of the second DA converter and the output of the third DA converter are amplified by 0.5 times. Alternatively, a signal obtained by combining the output of the second DA converter with the output of the third DA converter is amplified by 0.5 times. This generates a compensation glitch waveform with a magnitude of 20 mV as illustrated in FIG. 10D. Combining the output of the first DA converter illustrated in FIG. 10A with the compensation glitch waveform illustrated in FIG. 10D effectively cancels the glitch as illustrated in FIG. 10E.

In the embodiments illustrated in FIG. 1 and FIG. 4, a glitch included in the output of the first DA converter is cancelled by using a plurality of combiners. However, the number of combiners may be reduced to one. For example, a waveform generating device illustrated in FIG. 11 includes a DA converter 80 serving as a first DA converter, DA converters 81 to 83 constituting a second DA converter group, DA converters 88 and 89 constituting a third DA converter group, and a combiner 90 configured to add up the outputs of the respective DA converters to combine them together.

There are three cases where a large glitch occurs in the output of the DA converter 80. The first is where the most significant bit of input data is inverted, the second is where the most significant bit of input data is "1" and the second high-order bit is inverted, and the third is where the most significant bit of input data is "0" and the second high-order bit is inverted. The magnitude of a glitch differs in each case. Also, the magnitude (absolute value) of a glitch differs depending on whether the bit inversion is associated with an increase or decrease of input data received by the DA converter 80.

Table 1 below shows examples of the magnitude of a glitch that occurs in the output of the DA converter 80.

TABLE 1

| Bit inversion of input data | Magnitude of glitch (mV) | |
|---|---|---|
| | Increase (→) | Decrease (←) |
| 0011 ⇔ 100 | 20 | −10 |
| 0111 ⇔ 1000 | 50 | −50 |
| 1011 ⇔ 1100 | 15 | −30 |

With the assumption that a glitch occurring in the DA converters 81 to 83 is the same as that in the DA converter 80, different amplification factors are set for the DA converters 81 to 83. Then, in accordance with the inverted bit of the input data received by the DA converter 80, the output of one of the DA converters 81 to 83 is combined with the output of the DA converter 80, so that a glitch that occurs in the output of the DA converter 80 is effectively suppressed.

If the most significant bit of input data to the DA converter 80 is 0 and the second high-order bit is inverted, the controller 60 outputs to the DA converter 81 a signal where the most significant bit is 1 and the second high-order bit is inverted and whose increase and decrease are opposite those of the input data to the DA converter 80. The output of the DA converter 81 is multiplied by 0.67. A glitch used to compensate for a glitch included in the output of the DA converter 80 is thus obtained.

For example, when input data to the DA converter 80 increases from "0011" to "0100", the magnitude of a glitch included in the output of the DA converter 80 is 20 mV. In this case, an input to the DA converter 81 decreases from "1100" to "1011", and the magnitude of a glitch included in the output obtained by being multiplied by 0.67 is −20 mV (=−30×0.67). This makes it possible to compensate for the glitch included in the output of the DA converter 80.

When input data to the DA converter 80 decreases from "0100" to "0011", the magnitude of a glitch included in the output of the DA converter 80 is −10 mV. In this case, an input to the DA converter 81 increases from "1011" to "1100", and the magnitude of a glitch included in the output obtained by being multiplied by 0.67 is 10 mV (=15×0.67). This makes it possible to compensate for the glitch included in the output of the DA converter 80.

If the most significant bit of input data to the DA converter 80 is inverted, the controller 60 outputs to the DA converter 82 a signal where the most significant bit is inverted and whose increase and decrease are opposite those of the input data to the DA converter 80. The amplification factor for the output of the DA converter 82 is 1.

For example, when input data to the DA converter 80 increases from "0111" to "1000", the magnitude of a glitch included in the output of DA converter 80 is 50 mV. In this case, an input to the DA converter 82 decreases from "1000" to "0111", and the magnitude of a glitch included in the output is −50 mV. This makes it possible to compensate for the glitch included in the output of the DA converter 80.

When input data to the DA converter 80 decreases from "1000" to "0111", the magnitude of a glitch included in the output of the DA converter 80 is −50 mV. In this case, an input to the DA converter 82 increases from "0111" to "1000", and the magnitude of a glitch included in the output is 50 mV. This makes it possible to compensate for the glitch included in the output of the DA converter 80.

If the most significant bit of the input data to the DA converter 80 is 1 and the second high-order bit is inverted, the controller 60 outputs to the DA converter 83 a signal where the most significant bit is 0 and the second high-order bit is inverted and whose increase and decrease are opposite those of the input data to the DA converter 80. The output of the DA converter 83 is multiplied by 1.5. A glitch used to compensate for a glitch included in the output of the DA converter 80 is thus obtained.

For example, when input data to the DA converter 80 decreases from "1100" to "1011", the magnitude of a glitch included in the output of the DA converter 80 is −30 mV. In this case, an input to the DA converter 81 increases from "0011" to "0100", and the magnitude of a glitch included in the output obtained by being multiplied by 1.5 is 30 mV (=20×1.5). This makes it possible to compensate for the glitch included in the output of the DA converter 80.

When input data to the DA converter 80 increases from "1011" to "1100", the magnitude of a glitch included in the output of the DA converter 80 is 15 mV. In this case, an input to the DA converter 81 decreases from "0100" to "0011", and the magnitude of a glitch included in the output obtained by being multiplied by 1.5 is −15 mV (=−10×1.5). This makes it possible to compensate for the glitch included in the output of the DA converter 80.

Note that one of the DA converters 88 and 89 is for cancelling the displacement of the outputs of the DA converters 81 to 83, whereas the other is for cancelling the offset.

As described above, the combiner 90 adds up and combines the output of the DA converter 80, the output of one of the DA converters 81 to 83 selected in accordance with the inverted bit of input data to the first DA converter 80, and the outputs of the DA converters 88 and 89, so that a glitch included in the output of the DA converter 80 is suppressed.

Figure 12:
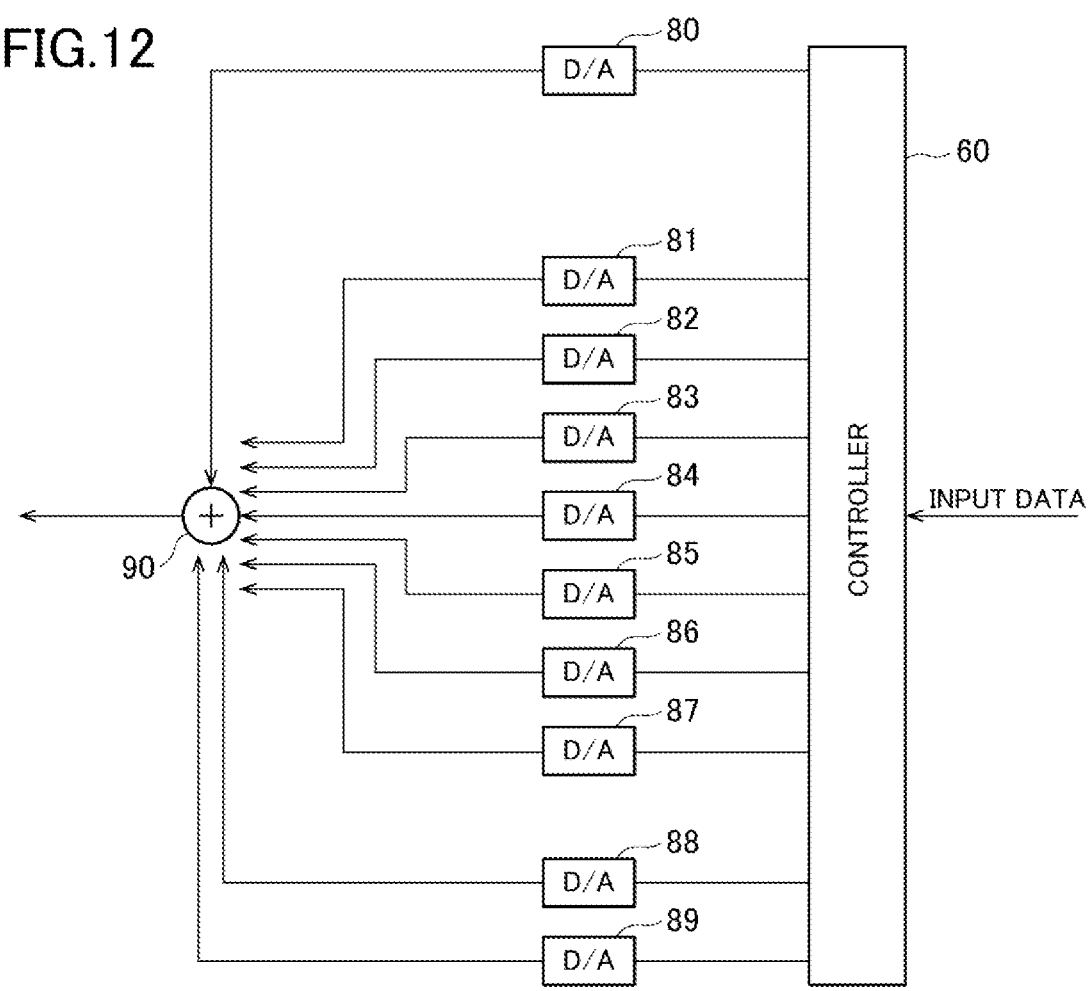
FIG. 12 is a block diagram of a waveform generating device according to another embodiment.

FIG. 11 illustrates a configuration used to compensate for a glitch that occurs when the first and second high-order bits are inverted. To compensate for a glitch that occurs when the first to third high-order bits are inverted, the second DA converter group is configured to further include DA converters 84 to 87 as illustrated in FIG. 12. Amplification factors for the outputs of the DA converters 84 to 87 are appropriately set in accordance with the magnitude of a glitch that occurs when the third high-order bit is inverted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A waveform generating device comprising:
   a first DA converter converting input data from digital to analog and provide an output;
   a controller outputting a first signal having a command value based on the input data, and a second signal having a command value differing by a constant value from the command value of the first signal;
   a second DA converter converting the first signal from digital to analog and provide an output;
   a third DA converter converting the second signal from digital to analog and provide an output; and
   a combiner combining the output of the first DA converter, the output of the second DA converter, and the output of the third DA converter,
   wherein when a value of a predetermined first high-order bit of the input data is inverted, the controller changes the command value of the first signal such that a value of the first high-order bit or a second high-order bit different from the first high-order bit is inverted.

2. The form generating device according to claim 1, wherein the combiner includes a first subtractor subtracting the output of the third DA converter from the output of the second DA converter, and a second subtractor subtracting an output of the first subtractor from the output of the first DA converter.

3. The waveform generating device according to claim 1, wherein the command value of the first signal and the command value of the second signal differ by one least significant bit.

4. The waveform generating device according to claim 1, wherein the waveform generating device includes a plurality of second DA converters; and
the command value of the first signal received by each of the second DA converters is different in terms of an inverted bit, or is the same in terms of an inverted bit but different in the value of a higher-order bit than the inverted bit.

5. The waveform generating device according to claim 4, wherein the plurality of second DA converters amplify signals by different amplification factors and output the amplified signals.

6. A waveform generating method comprising:
converting input data from digital to analog using a first DA converter and outputting a voltage;
outputting to a second DA converter a first signal having a command value based on the input data, converting the first signal from digital to analog, and providing an output; and
outputting to a third DA converter a second signal having a command value differing by a constant value from the command value of the first signal, converting the second signal from digital to analog, and providing an output,
wherein when a value of a predetermined first high-order bit of the input data is inverted, the command value of the first signal is changed such that a value of the first high-order bit or a second high-order bit different from the first high-order bit is inverted; and
the output of the first DA converter, the output of the second DA converter, and the output of the third DA converter are combined to obtain a signal having a glitch that is smaller in magnitude than a glitch included in the output of the first DA converter.

7. The waveform generating method according to claim 6, wherein the output of the third DA converter is subtracted from the output of the second DA converter using a first subtractor; and
an output of the first subtractor is subtracted from the output of the first DA converter using a second subtractor to obtain a signal having the glitch reduced in magnitude.

8. The waveform generating method according to claim 6, wherein the command value of the first signal and the command value of the second signal differ by one least significant bit.

9. The waveform generating method according to claim 6, wherein the first signal is output to each of a plurality of second DA converters, converted from digital to analog, and output; and
the command value of the first signal received by each of the second DA converters is different in terms of an inverted bit, or is the same in terms of an inverted bit but different in the value of a higher-order bit than the inverted bit.

10. The waveform generating method according to claim 9, wherein the plurality of second DA converters are configured to amplify signals by different amplification factors and output the amplified signals.

11. A charged particle beam irradiation apparatus comprising:
an emitting unit emitting a charged particle beam,
a stage holding a substrate thereon;
a deflection control circuit including the waveform generating device according to claim 1, the deflection control circuit outputting deflection data for deflecting the charged particle beam;
a deflector deflecting the charged particle beam in accordance with the deflection data from the deflection control circuit; and
a writer writing a pattern onto the substrate using the charged particle beam while moving a deflection position of the charged particle beam on the substrate.

12. The charged particle beam irradiation apparatus according to claim 11, wherein the combiner includes a first subtractor subtracting the output of the third DA converter from the output of the second DA converter, and a second subtractor subtracting an output of the first subtractor from the output of the first DA converter.

13. The charged particle beam irradiation apparatus according to claim 11, wherein the command value of the first signal and the command value of the second signal differ by one least significant bit.

14. The charged particle beam irradiation apparatus according to claim 11, wherein the waveform generating device includes a plurality of second DA converters; and
the command value of the first signal received by each of the second DA converters is different in terms of an inverted bit, or is the same in terms of an inverted bit but different in the value of a higher-order bit than the inverted bit.

15. The charged particle beam irradiation apparatus according to claim 14, wherein the plurality of second DA converters amplify signals by different amplification factors and output the amplified signals.

16. A charged particle beam irradiation apparatus comprising:
an emitting unit emitting a charged particle beam;
a stage holding a substrate thereon;
a writer including a deflector configured to deflect the charged particle beam, the writer writing a pattern onto the substrate using the charged particle beam while moving the stage and moving a deflection position of the charged particle beam on the substrate in such a manner as to follow the movement of the stage; and
a deflection control circuit outputting deflection data for deflecting the charged particle beam to the deflector,
wherein the writer causes a tracking amplifier to move the deflection position of the charged particle beam on the substrate in such a manner as to follow the movement of the stage, the tracking amplifier including the waveform generating device according to claim 1.

17. The charged particle beam irradiation apparatus according to claim 16, wherein the combiner includes a first subtractor subtracting the output of the third DA converter from the output of the second DA converter, and a second subtractor subtracting an output of the first subtractor from the output of the first DA converter.

18. The charged particle beam irradiation apparatus according to claim 16, wherein the command value of the first signal and the command value of the second signal differ by one least significant bit.

19. The charged particle beam irradiation apparatus according to claim 16, wherein the waveform generating device includes a plurality of second DA converters; and
 the command value of the first signal received by each of the second DA converters is different in terms of an inverted bit, or is the same in terms of an inverted bit but different in the value of a higher-order bit than the inverted bit.

20. The charged particle beam irradiation apparatus according to claim 19, wherein the plurality of second DA converters amplify signals by different amplification factors and output the amplified signals.

* * * * *